United States Patent
Reyzin et al.

(10) Patent No.: US 6,588,498 B1
(45) Date of Patent: Jul. 8, 2003

(54) THERMOSIPHON FOR ELECTRONICS COOLING WITH HIGH PERFORMANCE BOILING AND CONDENSING SURFACES

(75) Inventors: Ilya Reyzin, Williamsville, NY (US); Mohinder Singh Bhatti, Amherst, NY (US); Debashis Ghosh, Amherst, NY (US); Shrikant Mukund Joshi, Williamsville, NY (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 10/198,321

(22) Filed: Jul. 18, 2002

(51) Int. Cl.[7] .............................................. F28D 15/00
(52) U.S. Cl. ........................ 165/104.33; 165/104.21; 361/700; 257/716; 174/15.2
(58) Field of Search ................... 165/104.33, 104.21, 165/104.26; 361/700; 257/715, 716; 174/15.2

(56) References Cited

U.S. PATENT DOCUMENTS

| | | | | |
|---|---|---|---|---|
| 4,027,728 A | * | 6/1977 | Kobayashi et al. ..... | 165/104.33 |
| 5,198,889 A | * | 3/1993 | Hisano et al. ............. | 257/715 |
| 5,694,295 A | * | 12/1997 | Mochizuki et al. ........ | 361/699 |
| 5,871,043 A | * | 2/1999 | Osakabe et al. ........ | 165/104.21 |
| 5,998,863 A | * | 12/1999 | Kobayashi et al. ........ | 257/715 |
| 6,005,772 A | * | 12/1999 | Tero et al. ................. | 361/699 |
| 6,341,646 B1 | * | 1/2002 | Tanaka et al. .......... | 165/104.33 |
| 6,360,814 B1 | * | 3/2002 | Tanaka et al. .......... | 165/104.33 |

* cited by examiner

Primary Examiner—Henry Bennett
Assistant Examiner—Terrell McKinnon
(74) Attorney, Agent, or Firm—Patrick M. Griffin

(57) ABSTRACT

A thermosiphon for cooling an electronic device having a mean width of dimension "b" comprises a boilerplate having a top surface and including a plurality of pyramid shaped fins projecting upwardly from the top surface. The boilerplate also has a bottom surface for receiving the electronic device to be cooled. A plurality of spaced apart condenser tubes is mounted above the boilerplate such that the boilerplate and the condenser tubes define a vapor chamber therebetween for receiving a working fluid therein. A plurality of convoluted fins extends between each adjacent pair of condenser tubes.

28 Claims, 3 Drawing Sheets

THERMOSIPHON FOR ELECTRONICS COOLING WITH HIGH PERFORMANCE BOILING AND CONDENSING SURFACES

TECHNICAL FIELD

The present invention relates to heat sinks in general, and more particularly to heat sinks for use in dissipating waste heat generated by electrical or electronic components and assemblies.

BACKGROUND OF THE INVENTION

Research activities have focused on developing heat sinks to efficiently dissipate heat from highly concentrated heat sources such as microprocessors and computer chips. These heat sources typically have power densities in the range of about 5 to 35 W/cm$^2$ (4 to 31 Btu/ft$^2$s) and relatively small available space for placement of fans, heat exchangers, heat sinks and the like.

At the component level, various types of heat exchangers and heat sinks have been used that apply natural or forced convection or other cooling methods. The most commonly existing heat sinks for microelectronics cooling have generally used air to directly remove heat from the heat source. However, air has a relatively low heat capacity. Such heat sinks are suitable for removing heat from relatively low power heat sources with power density in the range of 5 to 15 W/cm$^2$ (4 to 13 Btu/ft$^2$s). Increases in computing speed resulted in corresponding increases in the power density of the heat sources in the order of 20 to 35 W/cm$^2$ (18 to 31 Btu/ft$^2$s) thus requiring more effective heat sinks. Liquid-cooled heat sinks employing high heat capacity fluids like water and water-glycol solutions are more particularly suited to remove heat from these types of high power density heat sources. One type of liquid cooled heat sink circulates the cooling liquid so that the liquid removes heat from the heat source and is then transferred to a remote location where the heat is easily dissipated into a flowing air stream with the use of a liquid-to-air heat exchanger. These types of heat sinks are characterized as indirect heat sinks.

As computing speeds continue to increase even more dramatically, the corresponding powers densities of the devices rise up to 100 W/cm$^2$. The constraints of the necessary cooling system miniaturization coupled with high heat flux calls for extremely efficient, compact, simple and reliable heat sinks such as a thermosiphon. A typical thermosiphon absorbs the heat generated by the electronic device by vaporizing the captive working fluid on a boiling surface of the heat sink. This process is governed by well-known general theories of nucleate boiling. The vapor is then transferred to an air-cooled condenser where it liquefies by the process of film condensation over the condensing surface of the thermosiphon. The heat is rejected into an air stream flowing over a finned external surface of the condenser. The condensed liquid is returned back to the boiler by gravity. The heat transfer rate from the air-cooled fins on the exterior of the condenser is much lower than that for the processes of boiling and condensing occurring inside the thermosiphon. Therefore the corresponding fin area is necessarily relatively large compared to the chip surface area generating the heat.

The compact thermosiphons intended to fit in a computer case require boiling and condensing processes to occur in close proximity to each other thereby imposing conflicting thermal conditions in a relatively small volume. This poses significant challenges to the process of optimizing the thermosiphon performance.

Thus, what is desired is a thermosiphon optimization process to intensify the processes of boiling, condensation and convective heat transfer at the external surface of the condenser while maintaining low airside pressure drop.

SUMMARY OF THE INVENTION

One aspect of the present invention is a thermosiphon for cooling an electronic device having a mean width of dimension "b". The thermosiphon comprises a boilerplate having a top surface and including a plurality of pyramid shaped fins projecting upwardly from the top surface. The boilerplate also has a bottom surface for receiving the electronic device to be cooled. A plurality of spaced apart condenser tubes is mounted above the boilerplate such that the boilerplate and the condenser tubes define a vapor chamber therebetween for receiving a working fluid therein. A plurality of convoluted fins extends between each adjacent pair of condenser tubes.

Another aspect of the present invention is a thermosiphon for cooling an electronic device having a mean width of dimension "b". The thermosiphon comprises a boilerplate having a top surface including a plurality of pyramid shaped fins projecting upwardly from the top surface and a bottom surface for receiving the electronic device to be cooled. A plurality of spaced apart condenser tubes is mounted above the boilerplate. Each condenser tube has opposing side walls and at least one transverse partition wall extending between the opposing side walls and is intermediate the ends of the condenser tube. The boilerplate and the condenser tubes define a vapor chamber therebetween for receiving a working fluid therein. A plurality of convoluted fins extends between each adjacent pair of the condenser tubes.

Yet another aspect of the present invention is a heat sink assembly for cooling an electronic device. The heat sink assembly comprises an air moving device housed in a shroud for causing an axially directed airflow through the shroud and a duct having one end thereof attached to the shroud and in fluid communication therewith. And a thermosiphon attached to a second end of the duct and in fluid communication therewith. The thermosiphon comprises a boilerplate having a top surface and including a plurality of pyramid shaped fins projecting upwardly from the top surface. The boilerplate also has a bottom surface for receiving the electronic device to be cooled. A plurality of spaced apart condenser tubes is mounted above the boilerplate such that the boilerplate and the condenser tubes define a vapor chamber therebetween for receiving a working fluid therein. A plurality of convoluted fins extends between each adjacent pair of condenser tubes.

These and other advantages of the invention will be further understood and appreciated by those skilled in the art by reference to the following written specification, claims and appended drawings.

DETAILED DESCRIPTION OF THE PREFERRED EMBODIMENT

Figure 2:
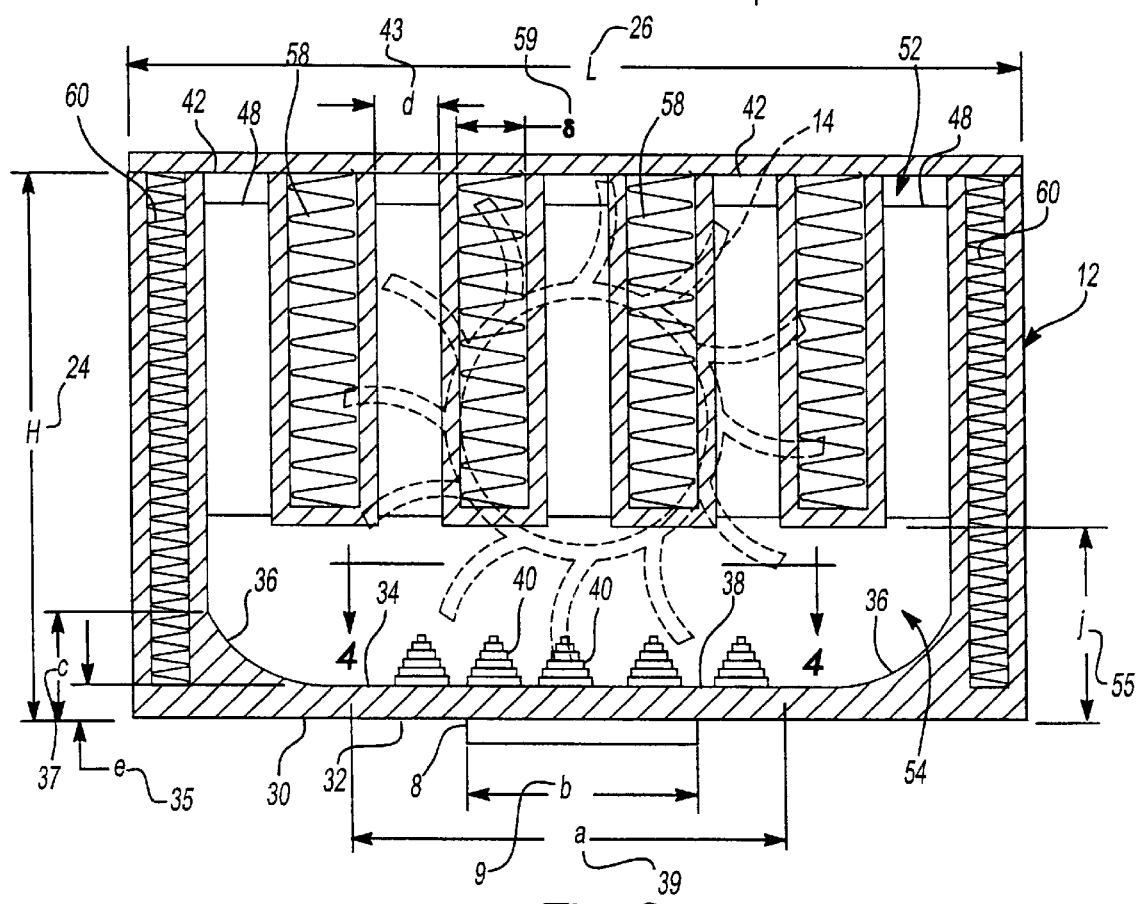
FIG. 2 is an elevational cross-section view of the thermosiphon shown in FIG. 1 and taken along the line 2—2.

For purposes of description herein, the terms "upper", "lower", "left", "rear", "right", "front", "vertical", "horizontal", and derivatives thereof shall relate to the invention as oriented in FIG. 2. However, it is to be understood that the invention may assume various alternative orientations and step sequences, except where expressly specified to the contrary. It is also to be understood that the specific devices and processes illustrated in the attached drawings, and described in the following specification, are simply exemplary embodiments of the inventive concepts defined in the appended claims. Hence, specific dimensions and other physical characteristics relating to the embodiments disclosed herein are not to be considered as limiting, unless the claims expressly state otherwise.

Figure 1:
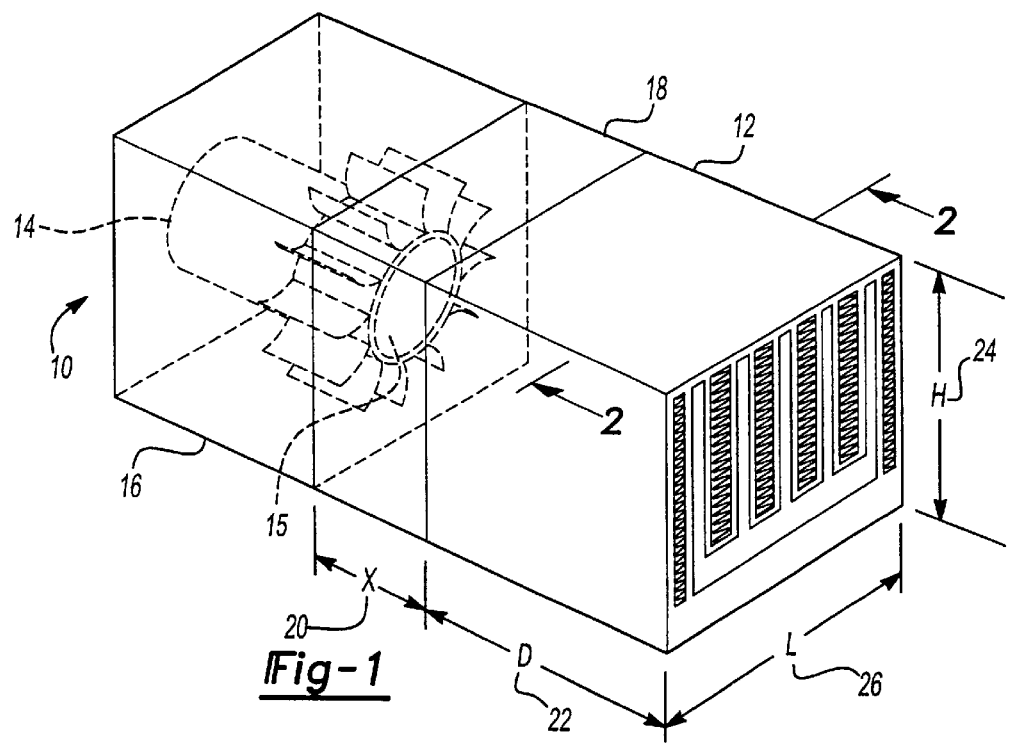
FIG. 1 is a perspective view of a thermosiphon and cooling fan embodying the present invention, wherein the fan is arranged to force cooling air through the thermosiphon.

Turning to the drawings, FIG. 1 shows an air-cooled thermosiphon heat sink 10, which is one of the preferred embodiments of the present invention and illustrates its various components.

As illustrated in FIG. 1 an air moving device here shown as a single axial fan 14 is housed in shroud 16 and coupled to thermosiphon 12 through duct 18. The fan 14 could be a pull or push type fan, however, a pull type of fan is preferred to minimize shadowing of the thermosiphon 12 by the fan hub 15. The shadowing effect with a push type fan reduces the airflow behind the hub and thereby interferes with the heat transfer from thermosiphon 12 to the cooling air stream. In order to maximize the air delivery and to ensure mixing of the air, the duct length 20, denoted as X, was found to be most optimally determined from the relation $0.1 \leq X/\sqrt{LH} \leq 0.3$. In this determination, L is the overall width 26 of thermosiphon 12 and H is the overall height 24 of thermosiphon 12.

Figure 7:
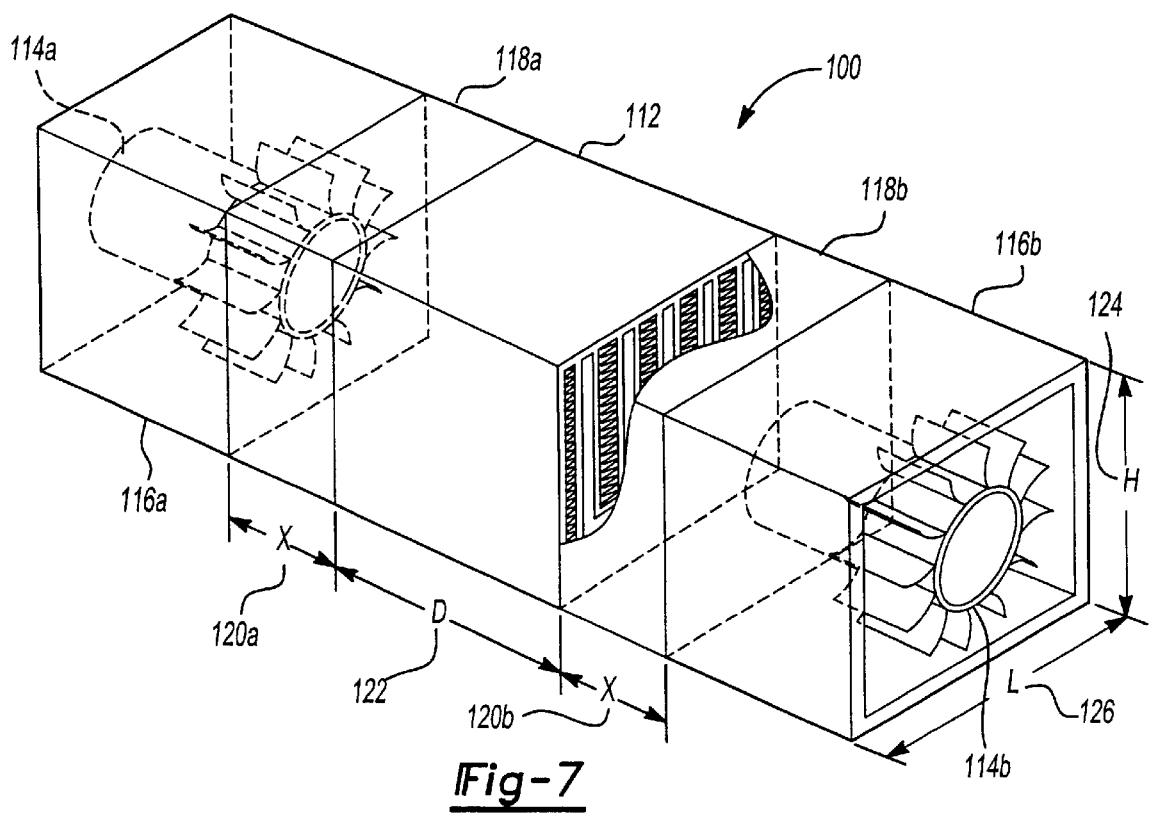
FIG. 7 is an alternate embodiment of a thermosiphon cooling assembly utilizing two cooling fans.

FIG. 7 illustrates an alternate embodiment thermosiphon heat sink assembly 100 incorporating a dual fan arrangement. In this embodiment, fan 114a housed in shroud 116a is a pull type fan that is coupled to thermosiphon 112 through duct 118a at one end of thermosiphon 112. At an opposite end of thermosiphon 112 is a second axial fan 114b housed in shroud 115b and coupled to the opposite end of thermosiphon 112 through duct 118b. The duct lengths X denoted as 120a and 120b are found according to the relation $0.1 \leq X/\sqrt{LH} \leq 0.3$ as above wherein, L is the overall width 126 of thermosiphon 112 and H is the overall height 124 of thermosiphon 112. Thermosiphon 112 in FIG. 7 is substantially identical to thermosiphon 12 in FIG. 1 as further described below. In operation, axial fan 114b pulls air from the ambient and forces the air through duct 118b to aid the operation of axial fan 114a in providing a desired airflow through thermosiphon 112.

Figure 3:
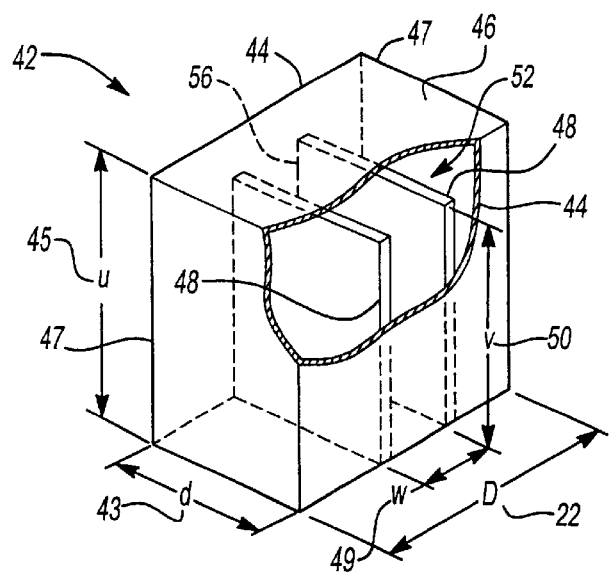
FIG. 3 is a partially broken perspective view of a condenser tube utilized in the thermosiphon of FIG. 1.

Referring now to FIGS. 2–6, thermosiphon 12 and its various features are shown in more detail. FIG. 2 is a cross-section through thermosiphon 12 that generally comprises a boilerplate 30 in combination with a plurality of condenser tubes 42 mounted thereabove and defining a vapor chamber 54 therebetween. Vapor chamber 54 has a height 55 denoted by dimension "j" and contains a cooling fluid therein (not shown). Air-cooled convoluted fins 58 extend between adjacent condenser tubes 42 and are affixed to sides 44 (FIG. 3). Fins 58 have a height 59 denoted by dimension "∂" corresponding to the lateral spacing of adjacent condenser tubes 42. Additional air-cooled convoluted fins 60 are affixed to each side of thermosiphon 12 to facilitate the cooling of the outermost walls 44 of the outermost condenser tubes 42. An electronic device 8 or other power source requiring cooling is attached to the bottom surface 32 of boilerplate 30. Device 8 could be either square or rectangular, and the mean width 9 of device 8 is denoted by dimension "b". The area of bottom surface 32 in thermal contact with the device 8 is preferably polished to reduce thermal resistance and promote maximum heat transfer between boilerplate 30 and device 8.

Internally, boilerplate 30 has an upper surface 33 including a flat central portion 34, which in combination with bottom surface 32 defines a thickness 35 denoted as "e". Central portion 34 further includes a finned area 38 having a mean width 39 denoted as dimension "a". Finned area 38 is populated with an array of step-pyramid fins 40, which are described in further detail below. An upwardly curved concave portion 36 having a height 37 denoted as dimension "c" and positioned at the outer periphery of boilerplate 30 surrounds central portion 34 thereby forming boilerplate 30 into a bowl-like structure. Upwardly curved portion 36 facilitates directing the condensed cooling fluid within thermosiphon 10 to central portion 34, and to spread the heat generated in the central flat portion 34 directly above the device 8.

Figure 4:
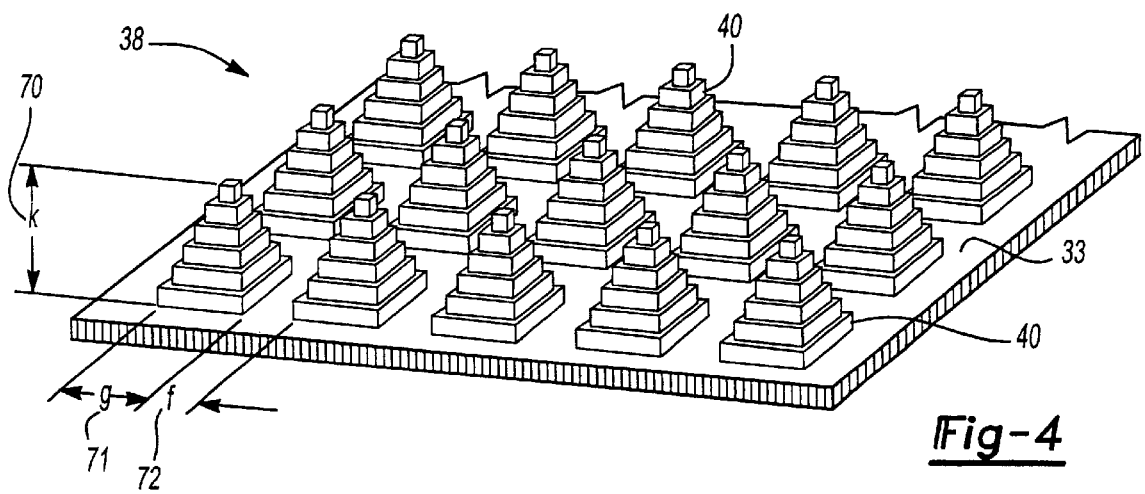
FIG. 4 is an enlarged perspective view of the pyramid fin array formed on the boilerplate.
Figure 5:
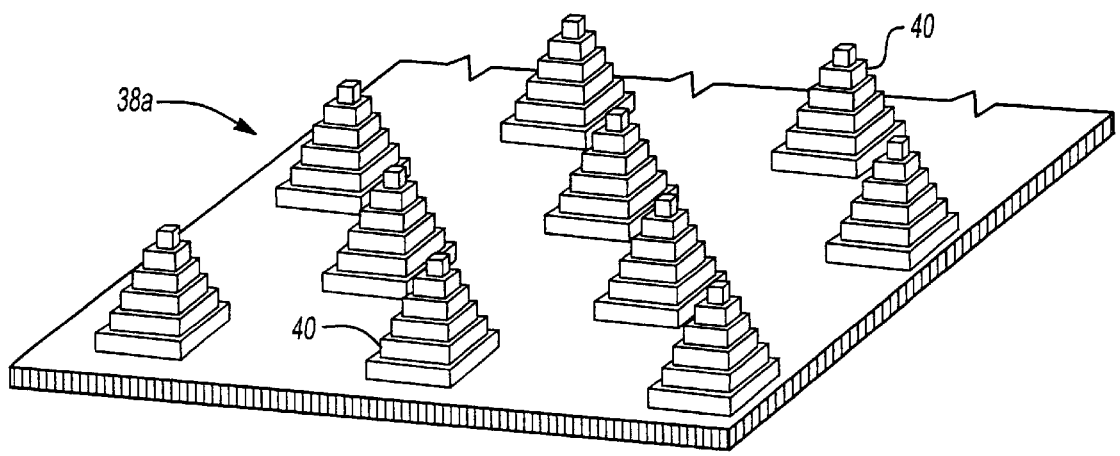
FIG. 5 is a enlarged perspective view of a non-uniform array of pyramid fins on the boilerplate.
Figure 6:
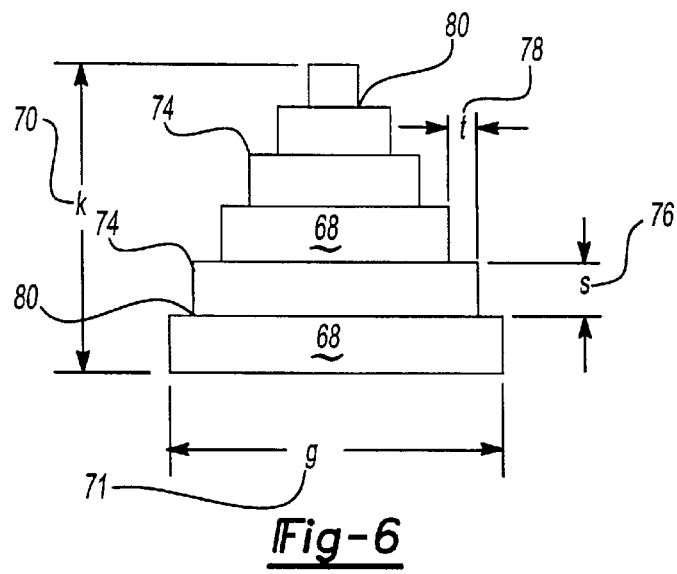
FIG. 6 is an enlarged elevation view of one of the pyramids from the array illustrated in FIG. 4.

FIGS. 4–6 illustrate in enlargement, the various features of finned portion 38 of boiler plate 30 and the step-pyramid fins 40. In the preferred embodiment, as illustrated in FIG. 4, the array of step-pyramid fins 40 are arranged in a rectangular grid-like pattern. The regular pattern of the step-pyramid fins 40 shown in FIG. 4 is most suited for a uniform heat load. Alternatively, the array of fins 40 can be arranged in staggered fashion as illustrated by finned portion 38a as illustrated in FIG. 5.

To accommodate a non-uniform heat load, step pyramids 40 can be arranged in irregular patterns on surface 33 of boilerplate 30. The irregular pattern can be arranged such that higher densities of fins are positioned directly above those areas of device 8 having a higher thermal output and a lower density of fins over those areas of device 8 having a lower thermal output. The irregular pattern of pyramid fins can have maximum fin densities up to 50 fins/cm$^2$. Each pyramid fin 40 has the appearance of having a plurality of layers with each successive layer from bottom to top having a smaller geometric area than the next subjacent layer. Alternatively, the step size of the pyramid fins can also be varied in order to compensate for heat flux non-uniformity.

In the preferred embodiment, and as illustrated in FIGS. 4 and 6, pyramid fins 40 have a square base. Those skilled in the art will readily recognize that pyramid fins 40 can also be formed as circular, triangular, rectangular, trapezoidal or other such geometric configurations without departing from the scope of the teaching herein. Further, surfaces of pyramid fins 40 such as surfaces 68 and the upper surface 33 of boilerplate 30 are exposed to the working fluid within thermosiphon 12 and further are preferably sand blasted or treated in an alternate manner to form the their respective surfaces 33, 68 into a rough texture. The roughness of surfaces 33, 68 enhances the boiling heat transfer from fins 40 to the working fluid covering fins 40.

Each stepped layer of pyramid fins 40 defines steps or outer corner regions 74 and inner corner regions 80 at the juncture of adjacent layers. Corner regions 74, 80 are regions of heat concentration. As a result of the heat concentrations in regions 74, 80, the regions serve as nucleation sites to promote the boiling of the cooling fluid within thermosiphon 12.

Each pyramid fin 40 has a height 70 denoted by dimension "k" wherein each step 74 has a height 76 denoted by dimension "s" and a step width 74 denoted by dimension "t". The maximum basal width 71 of step pyramid 40 is denoted by dimension "g", and the distance 72 between adjoining basal edges of adjacent pyramids is denoted by dimension "f".

In addition to the step-pyramid fins having a square base, shown in FIGS. 4 and 5, use of other types of step-pyramid fins with rectangular, triangular, trapezoidal and circular bases is also contemplated. In various types of step-pyramid fins the corner regions between the steps serve as nucleation sites promoting the liquid boiling due to steep temperature gradients. The corner regions of the step-pyramids could be viewed as the regions of heat concentration.

Based on theoretical and experimental study, the following dimensions of the pyramid fins were found to be optimal: $0.2 \leq f/g \leq 0.4$, $1 \leq k/g \leq 4$ and $1 \leq s/t \leq 2$ where "g" is the maximum basal width 71 of the pyramid, "f" is the distance 72 between basal edges of adjoining pyramids 40, "k" is the height 70 of pyramid fin 40, "s" is the step height 76 and "t" is the step width 78 of each step 74.

FIGS. 2 and 3 illustrate the placement of condenser tubes 42 on thermosiphon 12 and the detail features thereof. A plurality of condenser tubes 42 are arranged above the boilerplate 30. Each condenser tube 42 has a width 43 denoted by dimension "d" and height 45 denoted by dimension "u". Each condenser tube 42 also extends the full depth 22 of thermosiphon 12 as denoted by dimension "D". Adjacent condenser tubes 42 are spaced one from the other by dimension "δ" corresponding to height 59 of convoluted fins 58. Convoluted fins 58 are aligned to permit airflow therethrough from the front to the rear of thermosiphon 12 as a result of the airflow induced by axial fan 14.

Each condenser tube 42 is generally constructed of opposing sides 44 with a plurality of transverse partition walls 48 extending therebetween and a top 46 interconnecting the top edges of sides 44. End walls 47 are positioned at the front and rear of condenser tube 42 and extend from the bottom to top 46. Condenser tube 42 is open at the bottom and in fluid communication with vapor chamber 54 to permit fluid vapor to rise from chamber 54 into condenser tubes 42 and to further permit the cooled condensate to flow back into chamber 54. Partition walls 48 are bonded to the sidewalls 44 but are not bonded to the top surface 50. Partition walls 48 do not extend to top 46 and thereby define a gap 52 between partition wall 48 and top 46 to facilitate circulation of the fluid vapor throughout condenser tube 42.

The partition walls 48 serve multiple functions. First, they act as auxiliary fins to enhance the heat transfer from the vapor inside the condenser tube 42 to the air-cooled fins 58 bonded to the exterior of sidewalls 44 of condenser tubes 42. Walls 48 also reinforce the condenser tube 42 to withstand the high vapor pressure of working fluids such as halocarbons like R-134a. The walls 48 also promote condensate drainage as the condensed liquid on the interior of condenser tube wall 44 is drawn by surface tension into the corner 56 formed where partition walls 48 abut the interior of sidewalls 44. As the condensed liquid is drawn into the corner 56 by surface tension, it exposes the condenser tube interior surface thereby lowering its thermal resistance. The lowered thermal resistance promotes enhanced condensation of the working fluid vapor.

Based on extensive testing, the following dimensional relationships of the condenser tubes were determined to be optimal: the ratio of the height 50 (v) of the partition walls 48 to the height 45 (u) of condenser tube 42 is expressed by the relationship $0.90 \leq v/u \leq 0.97$, and the ratio of the partition wall spacing 49 (w) to the overall depth 22 (D) of thermosiphon 12 is expressed by the relationship $0.1 \leq w/D \leq 0.5$.

Working fluids most suitable for thermosiphon 12 include demineralized water and halocarbon fluids like R-134a. The volume of the working fluid generally is 30% of the internal volume of thermosiphon 12 comprising the internal volume of the condenser tubes 42 and the volume of the vapor chamber 54. The preferred level of the condensed working fluid in vapor chamber 54 under steady operating conditions should be such that the tips of pyramid fins 40 are just submerged beneath the top surface of the liquid pool.

Based the theoretical and experimental study, the following dimensional relationships of thermosiphon 12 were found to be optimal: the ratio of the mean width 39 (a) of the finned area 38 to the mean width 9 (b) of device 8 is expressed by the relationship $1 \leq a/b \leq 2$; the ratio of the height 55 (j) of vapor chamber 54 to the height 24 (H) of thermosiphon 12 is expressed by the relationship $0.1 \leq j/H \leq 0.3$; and the height 59 (δ) of convoluted fins 58 to the width 43 (d) of condenser tubes 42 is preferred to be within the range of $1 \leq \delta/d \leq 2$.

In use, as device 8 generates power and thus, heat, the heat so generated is transferred to finned portion 38 of boilerplate 30. As boilerplate 30 and especially finned portion 38 increase in temperature, surface 33 and pyramid fins 40 become sufficiently hot at corner regions 74 and 80 to cause the working liquid covering the pyramid fins 40 to nucleate or boil. The working fluid vapor rises and enters condenser tubes 42. The vapor contacts the sidewalls 44 and partition walls 48 of condenser tubes 42 and transfers thermal energy from the vapor to the walls 44 and 48 and by conduction to convoluted fins 58. Axial fan 14 causes cooling air to flow through convoluted fins 58 along dimension "D", convectively drawing heat therefrom. By removing thermal energy from the vapor, the vapor is cooled below its condensation temperature and condenses on walls 44 and 48. Surface tension effect then draws the condensed liquid to corner regions 56 in condenser tube 42. The liquid congregates into droplets which then fall back into the pool of working fluid in vapor chamber 54 whereupon the process is repeated.

Several prototype thermosiphons 12 comprising aluminum condenser tubes 42 and aluminum and copper boilerplates 30 with pyramid fins 40 were built and tested to validate the teachings herein. The overall dimensions of the thermosiphons were height H=80 mm, width L=70 mm and depth D=50 mm. A square power source, capable of generating 220 W of heat load, had a side dimension b=40 mm. The condenser tube dimensions were height u=70 mm, depth D=50 mm and width d=6 mm. Each condenser tube 42 comprised two partition walls 48 having a height v=65 mm and a spacing w=15 mm. The pyramid fin were sized to a width g=4 mm, height k=5 mm and an inter-pyramid spacing f=3 mm. The pyramid step height s=0.6 mm and the pyramid step width t=0.6 mm. The air inlet temperature was varied in the range 25 to 35° C. The thermosiphon was charged with 30 g of R-134a as the working fluid. The performance of the thermosiphons were measured for three heat loads q=100, 150 and 200 W with a copper boilerplate 30 and one heat load q̇=200 W with an aluminum boilerplate 30. The efficiency of the heat sink 10 is expressed as the surface-to-air thermal resistance RSA and is a function of the volumetric flow rate of air over the finned surface of the condenser tubes for the aforementioned values of the heat loads q̇.

In order to define the aforesaid RSA, it may be noted that the heat load q̇ from the convectively cooled thermosiphon is expressible in terms of Newton's cooling law as $$\dot{q} = hA(T_s - T_a) \quad (1)$$

where h is the heat transfer coefficient, W/m²° C. (Btu/hr ft²° F.)

$T_s$ is the maximum temperature of the boiler plate at the heat source, °C. (°F.)

$T_a$ is the incoming air temperature used to cool the finned condensing surface, °C. (°F.)

In analogy with Ohm's law, Equation (1) is customarily recast as $$RSA \equiv \frac{1}{hA} = \frac{(T_s - T_a)}{\dot{q}} \quad (2)$$

where RSA is defined as the surface-to-air thermal resistance of the heat sink.

It is apparent from Equation (2) that RSA is the ratio of the difference in temperature between the maximum heat source temperature $T_s$ and the inlet air temperature $T_a$ to the heat load q̇ of the heat source.

The results of testing thermosiphon according to a preferred embodiment showed that the RSA of the tested thermosiphons was below 0.1° C./W for volumetric airflow rates greater than 30 CFM. Such an RSA value is considered extremely good when viewed in the context of RSA values of conventional air and liquid-cooled heat sinks typically used in the electronics industry. For a typical air-cooled heat sink the exhibited RSA is about 0.2° C./W while for a typical liquid-cooled heat sink the RSA is about 0.12° C./W for volumetric airflow rates in excess of 30 CFM. The results also demonstrated that the thermosiphon exhibited lower RSA values as the heat loads tested were increased. Therefore, under conditions of high heat load, a thermosiphon embodying the present invention demonstrates increasingly lower RSA values of the than those of typical prior art air and liquid-cooled heat sinks. Thus, a thermosiphon heat sink such as the preferred embodiment described herein exhibits a definite improvement over the prior art and is a preferred choice for high heat load applications operating in the nucleate boiling regimes.

In the foregoing description those skilled in the art will readily appreciate that modifications may be made to the invention without departing from the concepts disclosed herein. Such modifications are to be considered as included in the following claims, unless these claims expressly state otherwise.

We claim:

1. A heat sink assembly for cooling an electronic device, said heat sink assembly comprising:

an air moving device housed in a shroud for causing an axially directed airflow through said shroud;

a duct having one end thereof attached to said shroud and in fluid communication therewith; and a thermosiphon attached to a second end of said duct and in fluid communication therewith, wherein said thermosiphon comprises:

a boilerplate, said boilerplate having a top surface including a plurality of pyramid shaped fins projecting upwardly from said top surface, and further having a bottom surface for receiving the electronic device to be cooled;

a plurality of spaced apart condenser tubes mounted above said boilerplate, said boilerplate and said condenser tubes defining a vapor chamber therebetween for receiving a working fluid therein; and a plurality of convoluted fins extending between each adjacent pair of said condenser tubes.

2. The heat sink assembly according to claim 1 wherein:

said duct has a length "X";

said thermosiphon has a width "L" and a height "H"; and further wherein said duct length "X" is determined by the relationship $0.1 \leq X/\sqrt{LH} \leq 0.3$.

3. A thermosiphon for cooling an electronic device having a mean width of dimension "b", said thermosiphon comprising:

a boilerplate, said boilerplate having a top surface including a plurality of pyramid shaped fins projecting upwardly from said top surface, and further having a bottom surface for receiving the electronic device to be cooled;

a plurality of spaced apart condenser tubes mounted above said boilerplate, each said condenser tube having opposing side walls and at least one transverse partition wall extending between said opposing side walls and intermediate ends of said condenser tube, said boilerplate and said condenser tubes defining a vapor chamber therebetween for receiving a working fluid therein; and a plurality of convoluted fins extending between each adjacent pair of said condenser tubes.

4. The thermosiphon according to claim 3, wherein each said condenser tube includes a plurality of said transverse partition walls.

5. The thermosiphon according to claim 4, wherein a top of said transverse partition walls in combination with a top of said condenser tube defines a gap therebetween.

6. The thermosiphon according to claim 5, wherein said plurality of convoluted fins are oriented to define air passageways substantially parallel to said boilerplate.

7. The thermosiphon according to claim 4, wherein said plurality of transverse partition walls are spaced one from another by a dimension of "w" and said condenser tube has a depth dimension "D" parallel to dimension "w" such that the ratio w/D falls within the expression $0.1 \leq w/D \leq 0.5$.

8. The thermosiphon according to claim 3, further including a second convoluted fin affixed to an outermost wall of each of an outermost condenser tube.

9. The thermosiphon according to claim 3, wherein said pyramid shaped fins include a plurality of steps thereon.

10. The thermosiphon according to claim 9, wherein said steps of said pyramid shaped fins include a plurality of faces, and further wherein said faces have a rough texture.

11. The thermosiphon according to claim 3, wherein said boilerplate includes end portions having a thickness greater than a center portion of said boilerplate.

12. The thermosiphon according to claim 11, wherein a top surface of said end portions defines a concave surface for directing a working fluid retained in said vapor chamber toward a central portion thereof.

13. A thermosiphon for cooling an electronic device having a mean width of dimension "b", said thermosiphon comprising:

a boilerplate, said boilerplate having a top surface including a plurality of pyramid shaped fins projecting upwardly from said top surface, and further having a bottom surface for receiving the electronic device to be cooled;

a plurality of spaced apart condenser tubes mounted above said boilerplate, said boilerplate and said condenser tubes defining a vapor chamber therebetween for receiving a working fluid therein; and a plurality of convoluted fins extending between each adjacent pair of said condenser tubes.

14. The thermosiphon according to claim 13, wherein said pyramid shaped fins include a plurality of steps thereon.

15. The thermosiphon according to claim 14, wherein said steps define a plurality of corner regions functioning as nucleation site for enhancing the boiling of a working fluid retained within said vapor chamber.

16. The thermosiphon according to claim 15, wherein said steps of said pyramid shaped fins include a plurality of faces, and further wherein said faces have a rough texture.

17. The thermosiphon according to claim 16, wherein said rough texture is formed by sandblasting.

18. The thermosiphon according to claim 14, herein each of said steps has a height "s" and a width "t", and said steps are formed such that the ratio s/t falls within the expression $1 \leq s/t \leq 2$.

19. The thermosiphon according to claim 14, wherein each of said pyramid shaped fins has a height "k" and a basal dimension "g", and said pyramid shape fins are formed such that the ration k/g falls within the expression $1 \leq k/g \leq 4$.

20. The thermosiphon according to claim 13, wherein said boilerplate defines a finned portion upon which said pyramid shaped fins are populated.

21. The thermosiphon according to claim 20, wherein said finned portion is in vertical alignment with an area on said bottom surface defined for receiving thereon the electronic device to be cooled.

22. The thermosiphon according to claim 21, wherein said pyramid shaped fins are arranged in a geometrical grid-like pattern.

23. The thermosiphon according to claim 22, wherein each said pyramid shaped fin includes a base having a basal dimension "g" and adjacent ones of said pyramid shaped fins have their respective bases spaced one from another by a dimension "f" such that the ratio f/g falls within the expression $0.2 \leq f/g \leq 0.4$.

24. The thermosiphon according to claim 23, wherein said finned area has a mean width of dimension "a" and the ratio a/b falls within the expression $1 \leq a/b \leq 2$.

25. The thermosiphon according to claim 21, wherein said pyramid shaped fins are arranged in an irregular pattern.

26. The thermosiphon according to claim 25, wherein said pyramid shaped fins are populated on said boilerplate with a density up to a maximum of 50 fins/cm$^2$.

27. The thermosiphon according to claim 13, wherein said boilerplate includes end portions having a thickness greater than a center portion of said boilerplate.

28. The thermosiphon according to claim 27, wherein a top surface of said end portions defines a concave surface for directing a working fluid retained in said vapor chamber toward a central portion thereof.

\* \* \* \* \*